(12) United States Patent
Chuang et al.

(10) Patent No.: US 9,858,997 B2
(45) Date of Patent: Jan. 2, 2018

(54) ELECTRONIC APPARATUS APPLYING UNIFIED NON-VOLATILE MEMORY AND UNIFIED NON-VOLATILE MEMORY CONTROLLING METHOD

(71) Applicant: NANYA TECHNOLOGY CORP., Taoyuan (TW)

(72) Inventors: Da-Zen Chuang, Taipei (TW); Chi-Hsiang Kuo, Taoyuan (TW)

(73) Assignee: NANYA TECHNOLOGY CORP., New Taipei (TW)

( * ) Notice: Subject to any disclaimer, the term of this patent is extended or adjusted under 35 U.S.C. 154(b) by 0 days.

(21) Appl. No.: 14/798,471

(22) Filed: Jul. 14, 2015

(65) Prior Publication Data
US 2017/0018305 A1    Jan. 19, 2017

(51) Int. Cl.
*G11C 11/00* (2006.01)
*G11C 13/00* (2006.01)
*G11C 11/16* (2006.01)

(52) U.S. Cl.
CPC .......... *G11C 13/0033* (2013.01); *G11C 11/16* (2013.01); *G11C 13/0004* (2013.01); *G11C 13/0007* (2013.01); *G11C 13/0011* (2013.01); *G11C 13/0035* (2013.01)

(58) Field of Classification Search
CPC .............. G11C 13/0033; G11C 13/003; G11C 13/0035
USPC ................................................. 365/148, 222
See application file for complete search history.

(56) References Cited

U.S. PATENT DOCUMENTS

| 2005/0099868 A1* | 5/2005 | Oh .......................... G11C 11/406 365/222 |
| 2007/0091707 A1* | 4/2007 | Hidaka .................. G11C 11/005 365/230.03 |
| 2014/0112086 A1* | 4/2014 | Park ....................... G11C 11/408 365/222 |

* cited by examiner

*Primary Examiner* — Tha-O H Bui
(74) *Attorney, Agent, or Firm* — Winston Hsu (57) ABSTRACT

An electronic apparatus comprising a unified non-volatile memory and a control unit is disclosed. The unified non-volatile memory comprises a first memory section, served as a read only memory; and a second memory section, served as a random access memory. The control unit controls the unified non-volatile memory. The first memory section further comprises: a first area for the first memory section; and a second area for the first memory section. The control unit adjusts a refresh rate of the second memory section according to a number of access times of the second memory section.

15 Claims, 10 Drawing Sheets

ELECTRONIC APPARATUS APPLYING UNIFIED NON-VOLATILE MEMORY AND UNIFIED NON-VOLATILE MEMORY CONTROLLING METHOD

BACKGROUND OF THE INVENTION

1. Field of the Invention

The present invention relates to an electronic apparatus applying a unified non-volatile memory and a unified non-volatile memory controlling method, and particularly relates to an electronic apparatus applying a unified non-volatile memory and a unified non-volatile memory controlling method, which can adjust a refresh rate for a ram of the unified non-volatile memory based on a number of access times.

2. Description of the Prior Art

A conventional electronic apparatus always comprises at least one volatile memory and a non-volatile memory for different applications. Many conventional techniques have disclosed such architecture.

Figure 1:
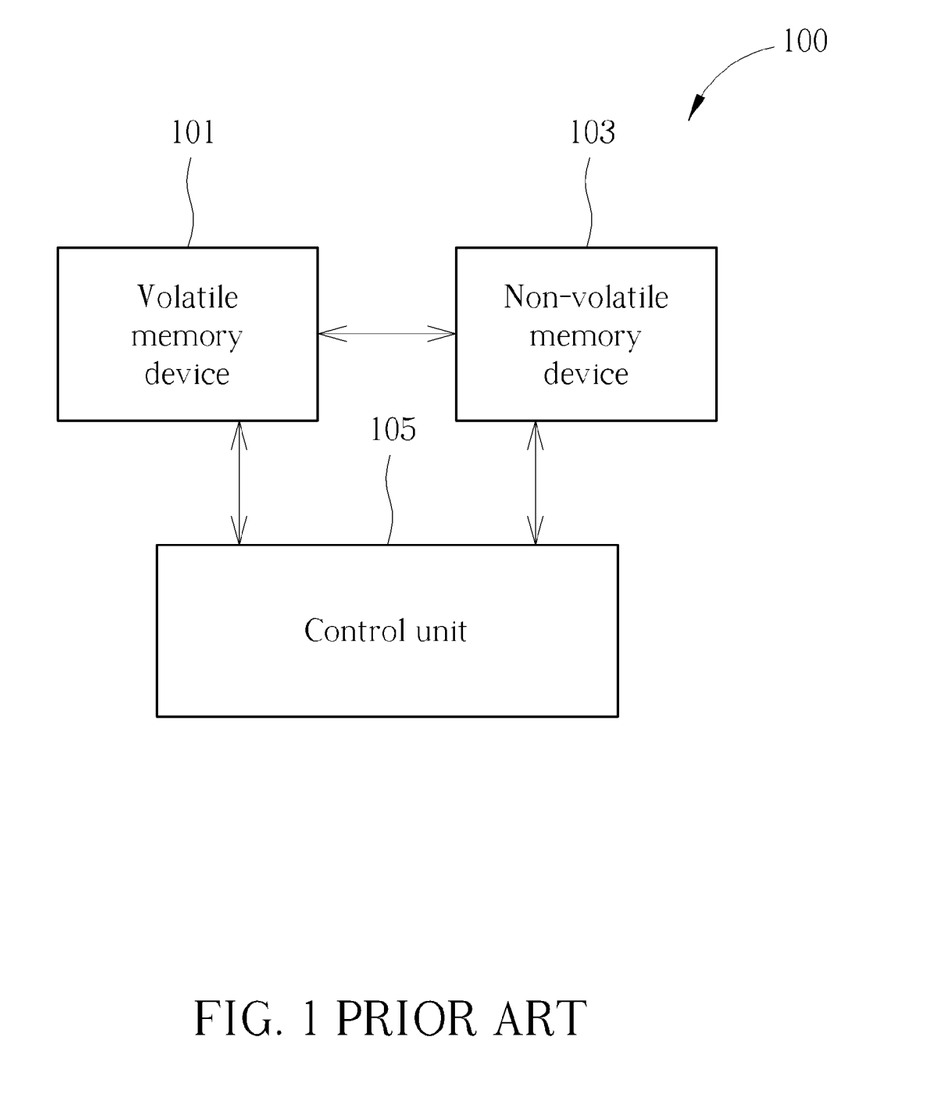
FIG. 1 is a block diagram illustrating a conventional electronic apparatus comprising a volatile memory and a non-volatile memory.

FIG. 1 is a block diagram illustrating a conventional electronic apparatus. As show in FIG. 1, the electronic apparatus 100 comprises a volatile memory 101, a non-volatile memory 103, and a control unit 105. The volatile memory 101, for example, a DRAM (Dynamic Random Access Memory) or a SRAM (Static Random Access Memory), can keep data when it is provided power but loses data while power is removed. On the contrary, the non-volatile memory 103, for example, a ROM (read only memory) or a flash memory, can keep data even it is not provided power.

Since the non-volatile memory 103 has lower cost, the non-volatile memory 103 is applied as a main storage to store data necessary for the electronic apparatus, for example, the code for the control unit 105. However, the access speed of the non-volatile memory 103 is low. Therefore, the volatile memory 101 is always applied to temporarily store data to speed up the access operation for the whole electronic apparatus 100, since the volatile memory 101 has high access speed.

However, the volatile memory 101 has high cost. Also, some volatile memories such as DRAMs need to be frequently refreshed thus the power consumption is high, such that the battery life for the electronic apparatus is short.

Therefore, an electronic apparatus which needs long battery life is not suitable to apply the architecture depicted in FIG. 1.

Further, many methods have been applied to extend the endurance of memories, for example, ECC error correcting or detecting the access times of each bit. However, such methods always need a complex algorithm.

SUMMARY OF THE INVENTION

Therefore, one objective of the present invention is to provide an electronic system that can improve the endurance of the memory via simple steps.

Another objective of the present invention is to provide a unified non-violate memory controlling method that can improve the endurance of the memory via simple steps.

One embodiment of the present invention discloses an electronic apparatus comprising a unified non-volatile memory and a control unit. The unified non-volatile memory comprises a first memory section, served as a read only memory; and a second memory section, served as a random access memory. The control unit controls the unified non-volatile memory. The first memory section further comprises: a first area for the first memory section; and a second area for the first memory section. The control unit adjusts a refresh rate of the second memory section according to a number of access times of the second memory section.

An unified non-violate memory controlling method can be acquired in view of above-mentioned embodiment, which comprises the steps of acquiring a number of access times of the second memory section; and adjusting a refresh rate of the second memory section according to the number of access times.

In view of above-mentioned embodiments, the refresh rate of the memory can be adjusted according to the number of access times. By this way, the endurance of the memory can be increased via simple steps.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
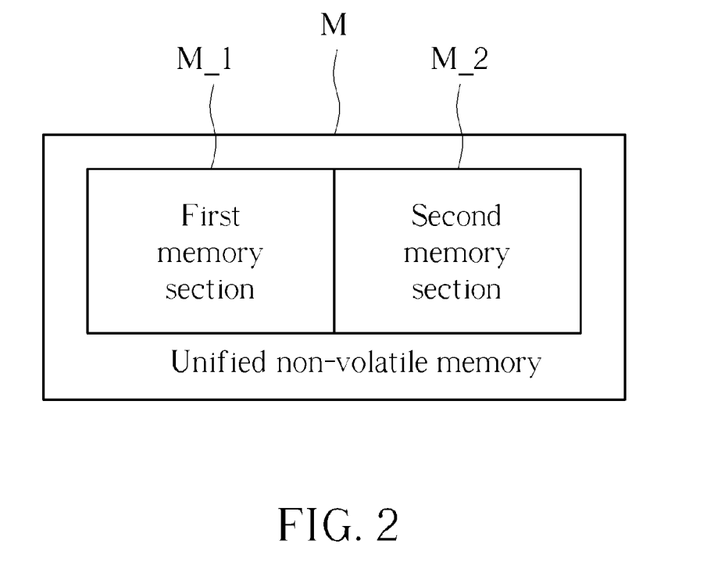
FIG. 2 is a block diagram illustrating a unified non-volatile memory according to one embodiment of the present invention.

FIG. 2 is a block diagram illustrating a unified non-volatile memory according to one embodiment of the present invention. As illustrated in FIG. 2, the unified non-volatile memory M comprises a first memory section M_1 and a second memory section M_2, which respectively serve as different types of memories. For more detail, the first memory section M_1 is served as a read only memory (ROM), and the second memory section M_2 is served as a random access memory (RAM).

Please note, the first memory section M_1 and the second memory section M_2 are built in a unified memory (i.e. the same memory), rather than two independent memories. Therefore, the first memory section M_1 and the second memory section M_2 are simultaneously manufactured by only one manufacturing process, rather than respectively manufactured by different manufacturing processes. Accordingly, the manufacturing for the unified non-volatile memory M is more simplified than the manufacturing for a plurality of independent memories.

The characteristics (ex. endurance, data retention) of the first memory section M_1 and the second memory section M_2 can be adjusted by varying manufacturing parameters. For example, vary doping density, or vary layer thickness, or vary sizes for all devices. By these ways, the characteristics of the first memory section M_1 and the second memory section M_2 can be adjusted to desired values. However, please note the methods for adjusting the characteristics of the first memory section M_1 and the second memory section M_2 are not limited to above-mentioned example.

In one embodiment, the memory endurance (i.e. the maximum access times) of the second memory section M_2 is higher than memory endurance of the first memory section M_1. For example, the first memory section M_1 has endurance of $10^6$ access times, and the second memory section M_2 has endurance larger than $10^{12}$~$10^{15}$ access times. Also, in one embodiment, the data retention (i.e. the time that the data can be kept) of the second memory section M_2 is lower than data retention of the first memory section M_1. For example, the first memory section M_1 has data retention larger than 10 years, and the second memory section M_2 has data retention for 1 sec or 1 min. However, it will be appreciated that other characteristics of the first memory section M_1 and the second memory section M_2 can be adjusted as well to meet different requirements.

Figure 3:
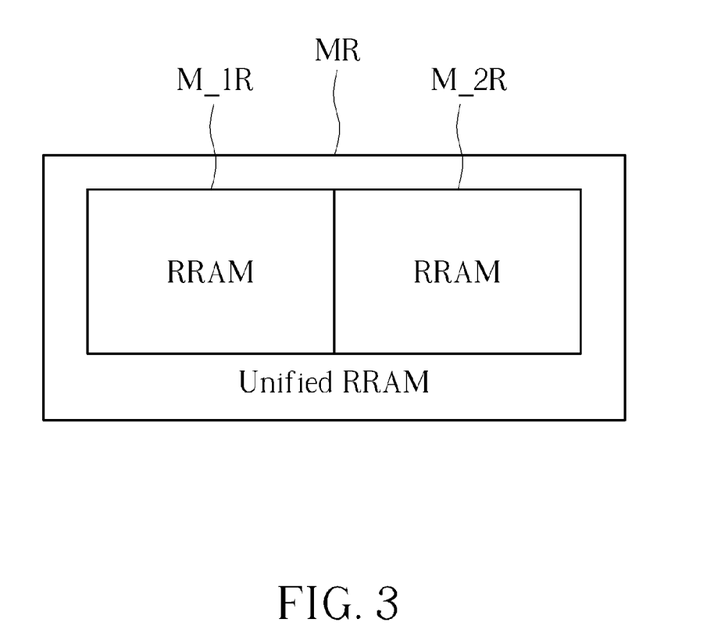
FIG. 3, FIG. 4 are examples for the unified non-volatile memory depicted in FIG. 2.
Figure 4:
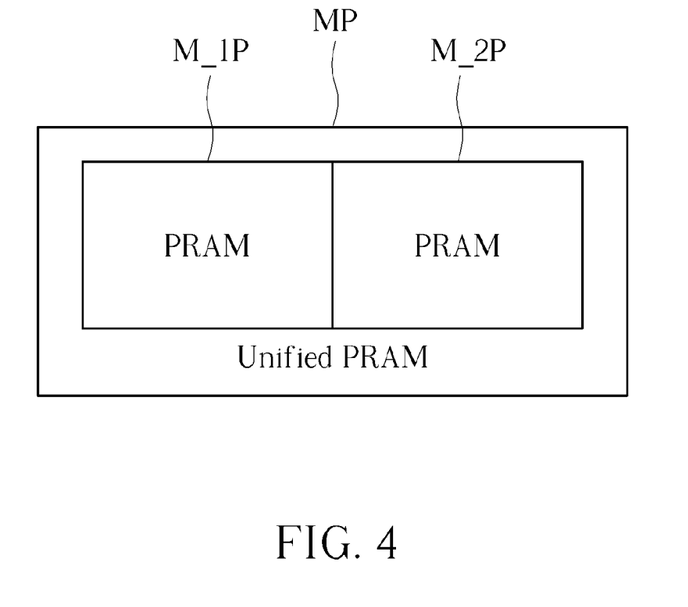

The unified non-volatile memory M can be any type of non-volatile memory. For example, as shown in FIG. 3, the unified non-volatile memory is a unified RRAM (Resistive random-access memory) MR, thus the first memory section and the second memory section are RRAMs M_1R, M_2R as well. For another example, as shown in FIG. 4, the unified non-volatile memory is a unified PRAM (Parameter Random Access Memory) MP, thus the first memory section and the second memory section are PRAMs M_1P, M_2P as well. In other examples, a phase change random access memory (PCRAM), a magnetoresistive random access memory (MRAM), a ferroelectric random access memory (FRAM), a conductive-bridging random access memory (CBRAM), and a resistive random access memory (ReRAM) can all be applied as the unified non-volatile memory M.

Figure 5:
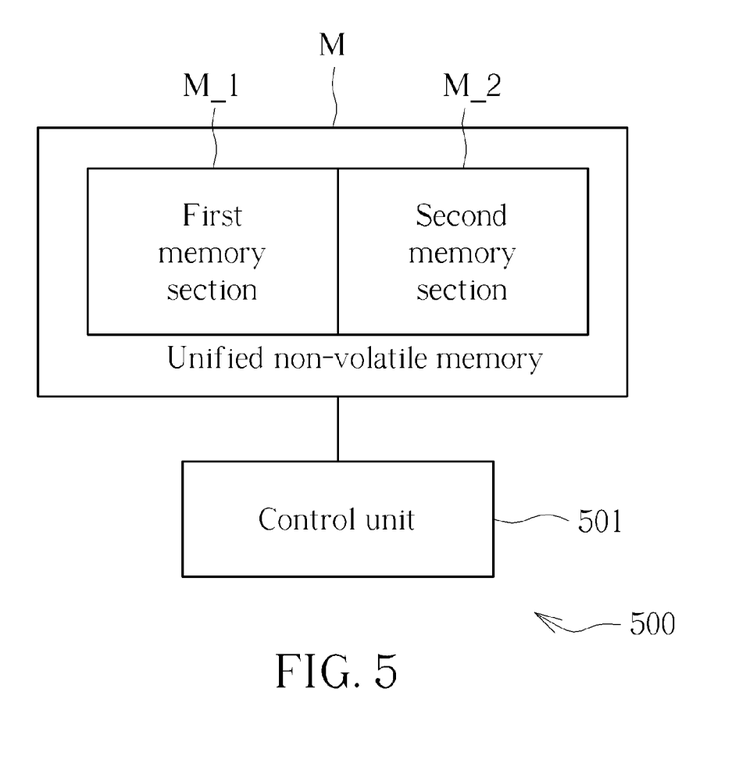
FIG. 5 is a block diagram illustrating an electronic apparatus applying the unified non-volatile memory depicted in FIG. 2.

FIG. 5 is a block diagram illustrating an electronic apparatus applying the unified non-volatile memory depicted in FIG. 2. As shown in FIG. 5, the electronic apparatus 500 comprises a control unit 501 and the unified non-volatile memory M depicted in FIG. 2. The control unit 501 controls the unified non-volatile memory M. That is, the control unit 501 can access the unified non-volatile memory M. In one embodiment, the control unit 501 controls the operations for the electronic apparatus in which the unified non-volatile memory M is provided, but not limited. In such embodiment, the first memory section M_1 stores the code necessary for the control unit 501 since it is served as a ROM. That is, the first memory section M_1 is served as a code memory for the control unit 501. Please note the control unit in the embodiment of FIG. 5 can be named for other terms in other applications, for example, a micro unit, a microprocessor, or a processor. Also, it will be appreciated that the electronic apparatus 500 can further comprise other devices, such as a real time clock, but not limited here. Further, please note the unified non-volatile memory can comprise more than two memory sections, e.g. the second memory section M_2 which is served as a RAM.

Figure 6:
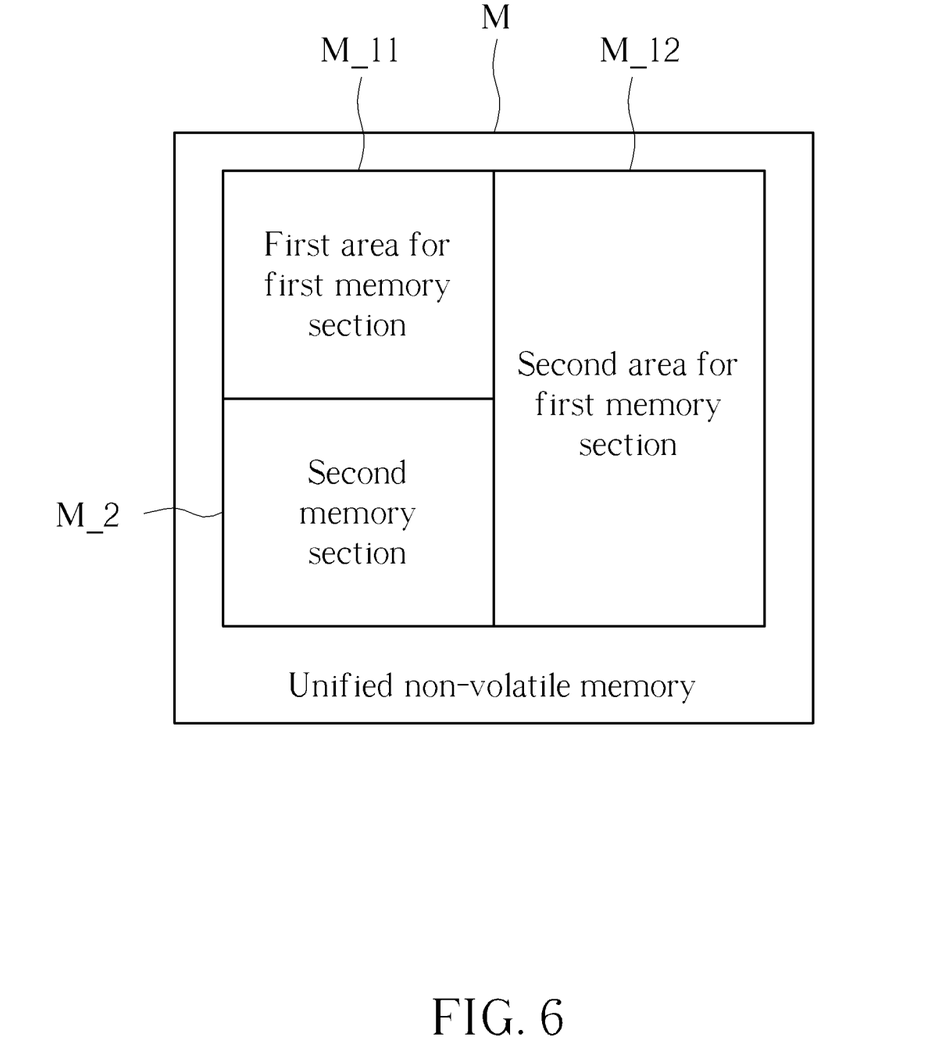
FIG. 6 is a block diagram illustrating a unified non-volatile memory according to another embodiment of the present invention.

FIG. 6 is a block diagram illustrating a unified non-volatile memory according to another embodiment of the present invention. In such embodiment, the first memory section further comprises a first area for first memory section M_11 and a second area for first memory section M_12. The first area for first memory section M_11 and a second area for first memory section M_12 provide different functions, which will be described later.

Figure 7:
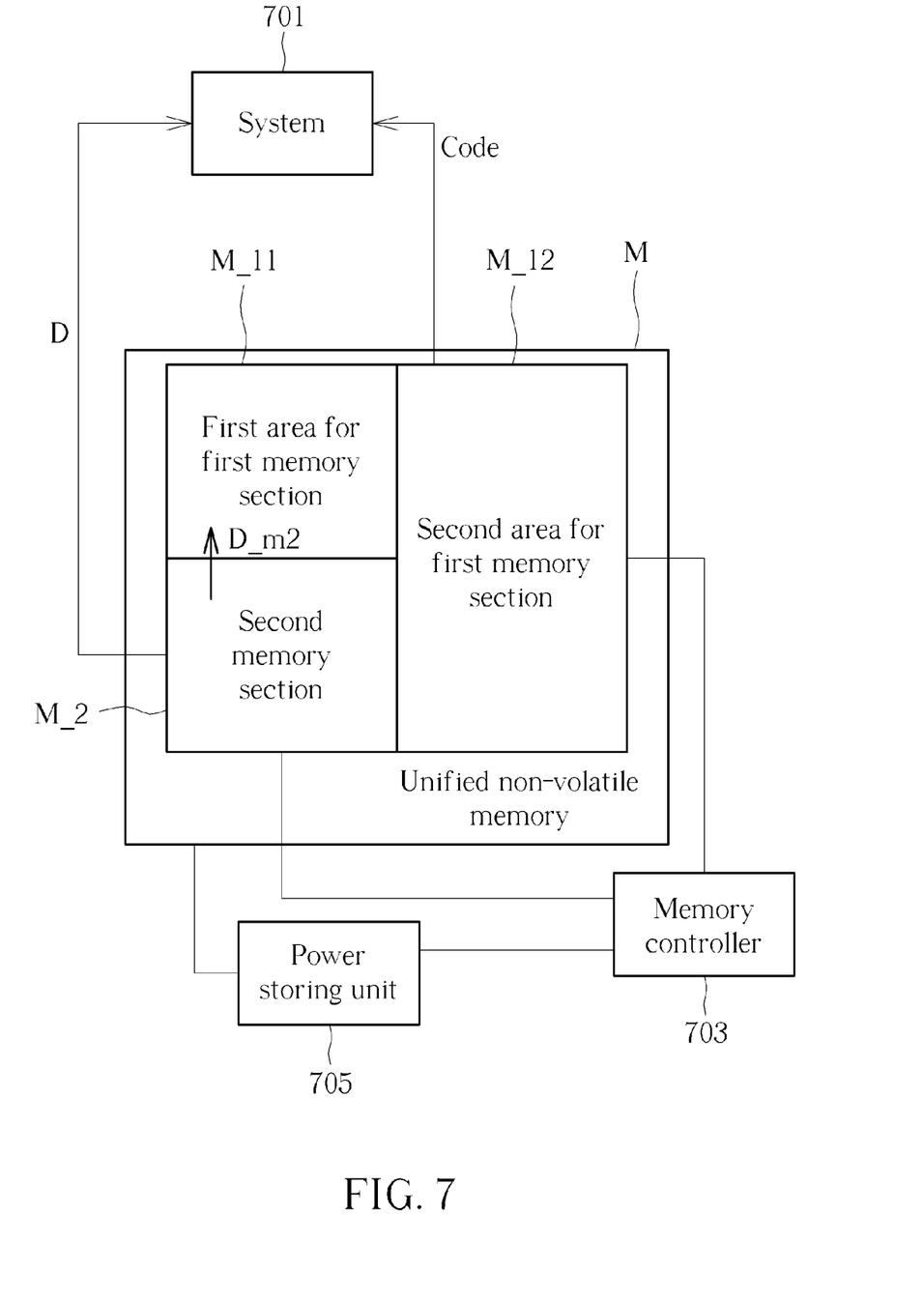
FIG. 7 is a block diagram illustrating an electronic apparatus applying the unified non-volatile memory depicted in FIG. 6.

FIG. 7 is a block diagram illustrating an electronic apparatus applying the unified non-volatile memory depicted in FIG. 6. If the system 701, which comprises the control unit 501 depicted in FIG. 5, and the unified non-volatile memory M are both active, the system 701 accesses data D to and from the second memory section M_2, and the system 701 can read code for the control unit Code from the second area for first memory section M_12. Also, if the system 701 is controlled to be turned off, before the non-volatile memory M is completely off, the second memory section M_2 backs up data D_m2 stored thereinto the first area for first memory section M_11. By this way, the first area for first memory section M_11 and the second area for first memory section M_12 are not limited to store code for the control unit, and the data in the second memory section M_2 served as a RAM can be well protected before the system is totally off. The memory controller 703 is applied to control the operations of the first area for first memory section M_11, the second area for first memory section M_12 and the second memory section M_2.

In one embodiment, a power storing unit 705 such as a capacitor is further provided in an IC which the memory controller 703 is provided in. The power storing unit can provide power to the memory controller 703 and the non-volatile memory M, such that the data can be backed up to the first area for first memory section M_11 even if the main power is suddenly cut.

Figure 8A:
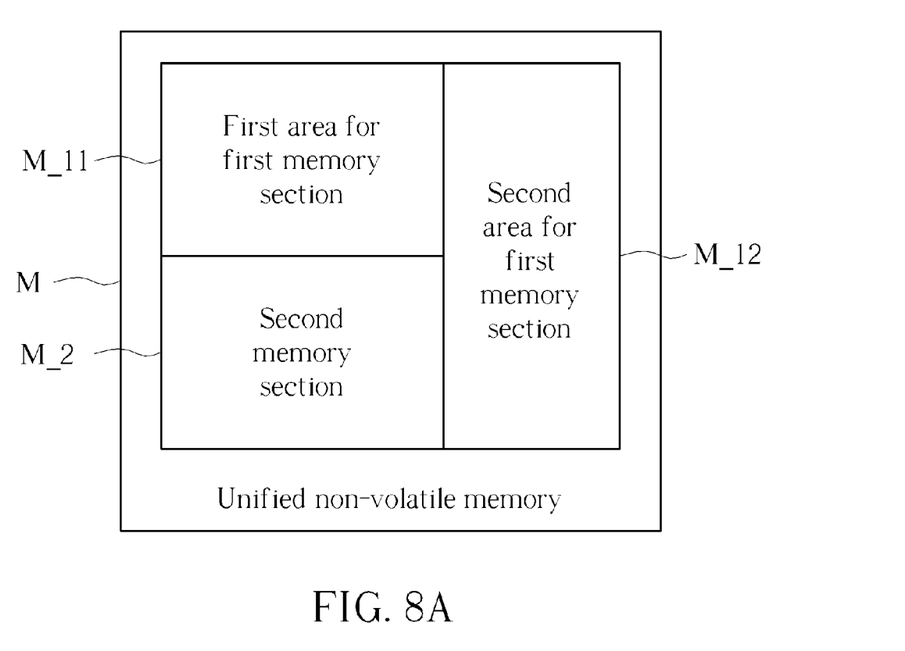
FIG. 8A and FIG. 8B are block diagrams illustrating unified non-volatile memories according to other embodiments of the present invention.
Figure 8B:
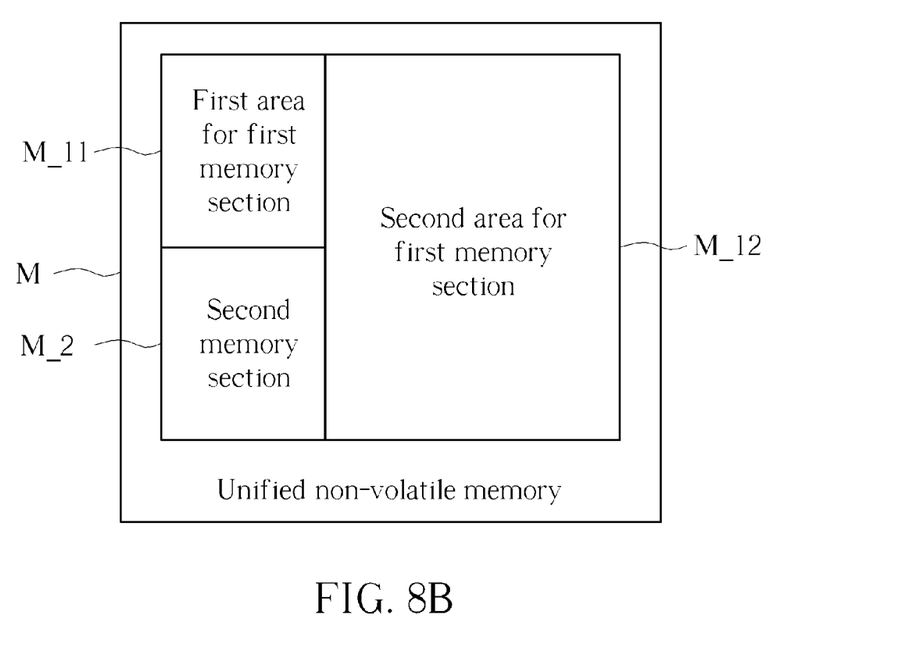

FIG. 8A and FIG. 8B are block diagrams illustrating unified non-volatile memories according to other embodiments of the present invention. In such embodiments, the size(s) or percentage(s) for at least the first area for the first memory section M_11, the second area for first memory section M_12 and the second memory section M_2 is programmable. For more detail, the size (s) or ratio (s) for at least one of the first area for the first memory section M_11, the second area for first memory section M_12 and the second memory section M_2 is decided by a program, which is stored in the second memory section M_2 in one example.

In the examples depicted in FIG. 8A and FIG. 8B, the size of the first area for the first memory section M_11 is the same as which of the second memory section M_2. However, the sizes of the first area for the first memory section M_11 and the second memory section M_2 are different for the examples depicted in FIG. 8A and FIG. 8B. Based on these examples, the density of the unified non-volatile memory M can be programmed to be different.

However, the endurance of a non-volatile memory is always lower than the endurance of a volatile memory. Therefore, the second memory section M_2 served as a ram in above-mentioned embodiments has endurance lower than a conventional RAM. For example, if the second memory section M_2 is an RRAM, the endurance thereof is $10^{10}$ access times. However, the endurance for a DRAM is $10^{12}$-$10^{15}$ access times. Accordingly, the present invention further provides a mechanism for improving the endurance for the second memory section M_2. For more detail, refresh operations can reduce errors for a memory, especially for retention errors, thus can extend the endurance for a memory if well controlled. Accordingly, the present invention provides a mechanism to increase the endurance for the second memory section M_2 via adjusting a refresh rate thereof.

Figure 9:
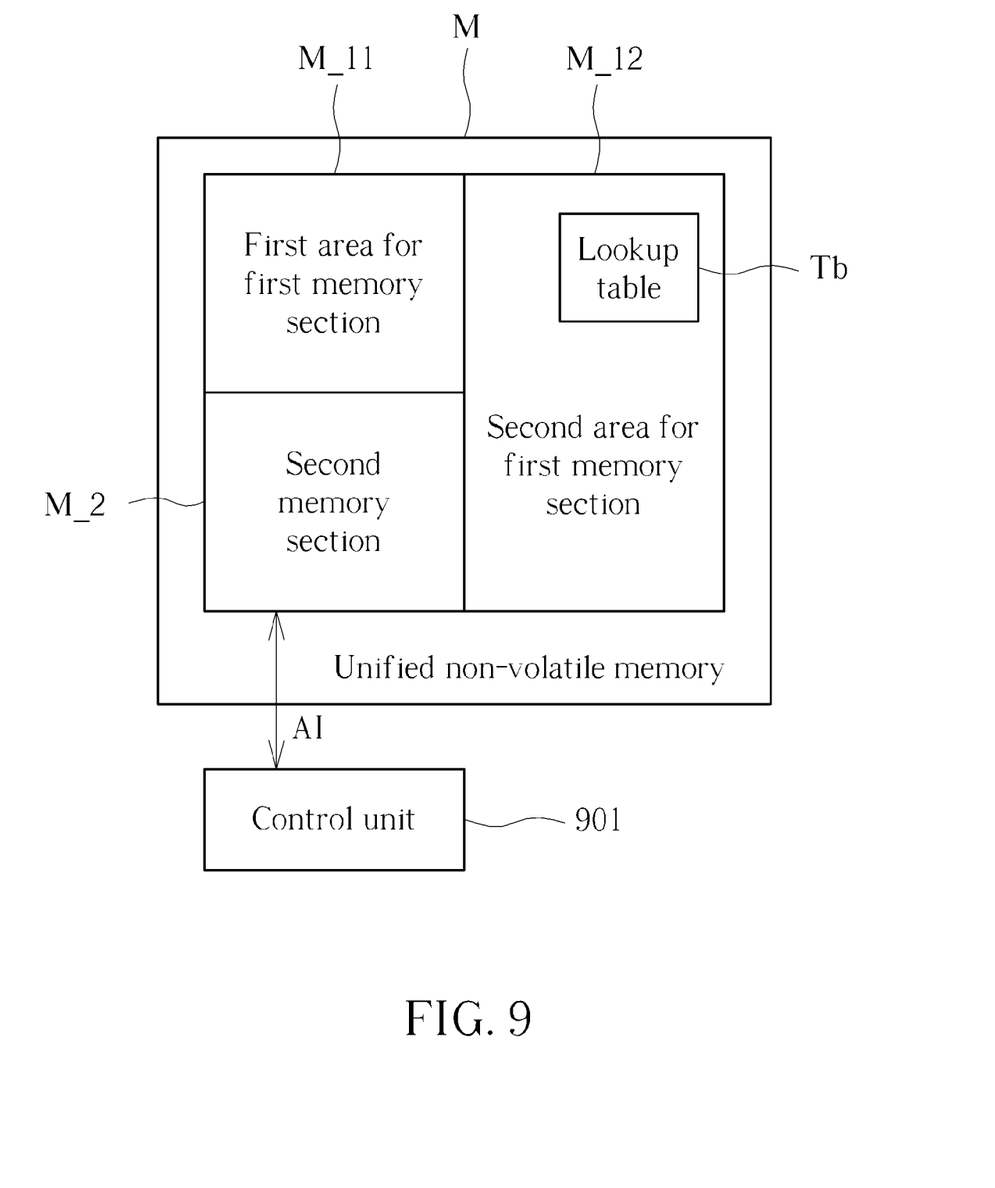
FIG. 9-FIG. 11 are block diagrams illustrating the operations for adjusting a refresh rate of the second memory section, according to one embodiment of the present invention.
Figure 10:
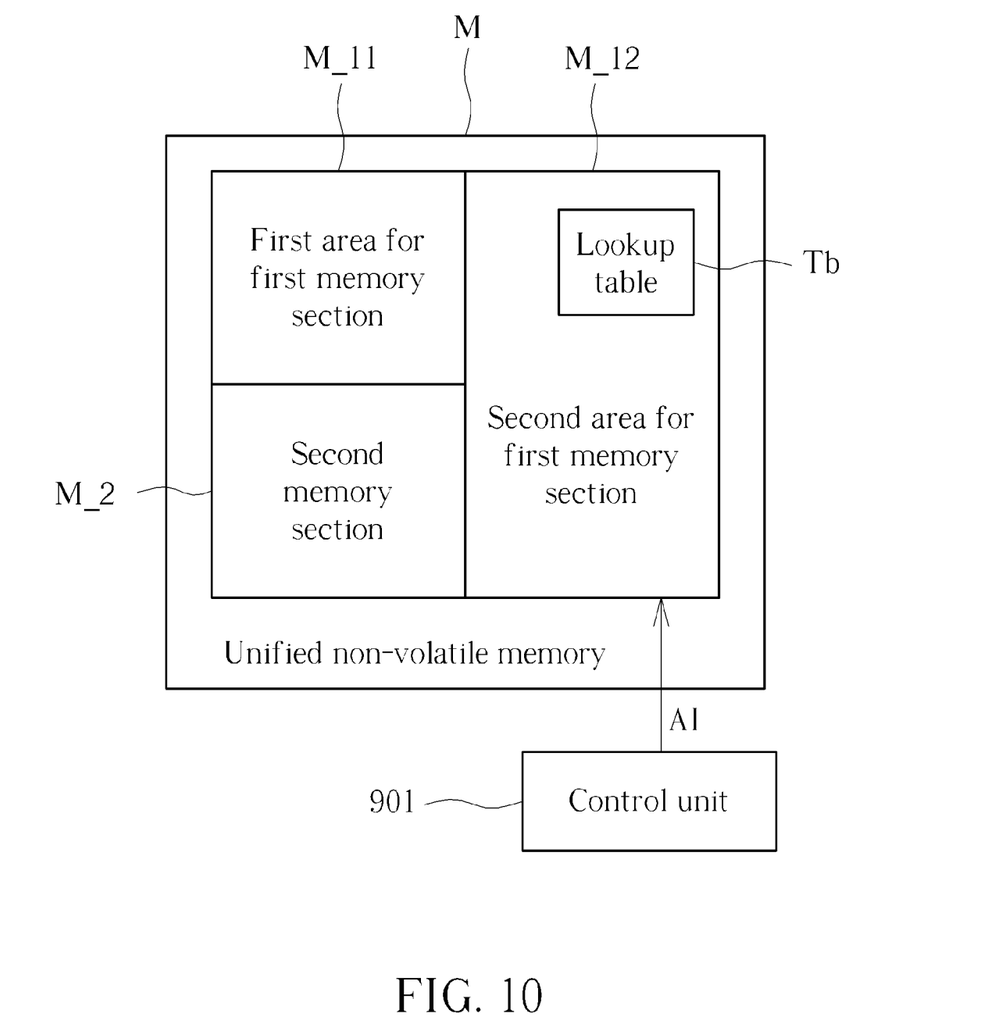
Figure 11:
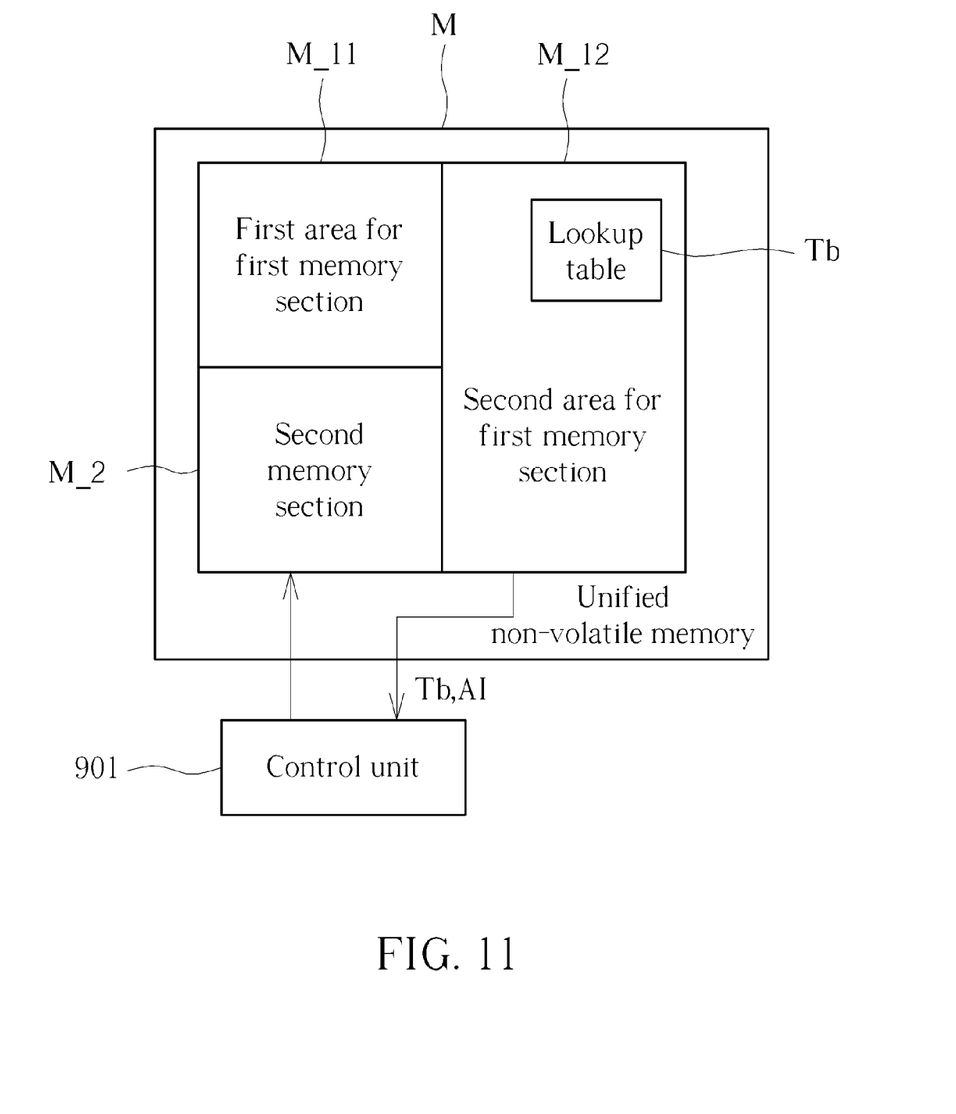

FIG. 9-FIG. 11 are block diagrams illustrating the operations for adjusting a refresh rate of the second memory section, according to one embodiment of the present invention. As shown in FIG. 9, the second area for the first memory section M_12 stores a refresh times lookup table Tb, and the control unit 901 counts a number the access times of the second memory section M_2 to generate access times information AI. In one embodiment, the control unit 901 comprises a counter configured to count the number access times of the second memory section M2.

In FIG. 10, the control unit 901 stores the access times information AI to the second area for first memory section M_12. In one embodiment, the control unit 901 stores the access times information AI to the second area for first memory section M_12 before the control unit 901 is turned off, and simultaneously the data stored in the second memory section M_2 is backed up to the first memory section M_11, as stated in the embodiment of FIG. 7. In FIG. 11, the control unit 901 reads the access times information AI and at least part of the refresh times lookup table Tb, and adjusts the refresh rate of the second memory section M_2 based on the access times information AI and the refresh times lookup table Tb.

The refresh times lookup table Tb contains information about the relations between the access times and the refresh rate, such as the following table Tb1. In such embodiment, the refresh rate of the second memory (i.e. 1/retention) is proportional to the number of access times of the second memory section.

TABLE 1

| Access times | 0 | $>10^{10}$ | $>10^{13}$ | $>10^{15}$ |
|---|---|---|---|---|
| Refresh rate | 1 day | 1 hour | 1 minute | 1 second |

Therefore, the control unit 901 can adjust the fresh rate of the second memory section M_2 according to the access times information AI and the relations between the access times and the refresh rate contained in the refresh times lookup table Tb. For examples, if the access times information AI indicates the access times of the second memory section M_2 is $10^{10}+1$, the refresh rate of the second memory section M_2 will be adjusted to 1 time/1 hour. In another example, if the second memory section M_2 is totally new and never be accessed, the refresh rate of the second memory section M_2 will be adjusted to 1 time/1 day.

Please note the table Tb1 is only for example and does not mean to limit the scope of the present invention. Further, the operation for the control unit 901 to adjust the refresh rate of the second memory section can be performed at various timings. For example, at least one check point can be pre-set and the operation for the control unit 901 to adjust the refresh rate of the second memory section is performed at the check point. In another example, the operation for the control unit 901 to adjust the refresh rate of the second memory section is performed while the control unit is transferred from off to on.

Via the operations depicted in FIG. 9-FIG. 11, the refresh operations are performed corresponding to the access times for the second memory section. The error rate of the memory section increases in proportion to the access times and data retention of the memory section. Accordingly, the present invention increases the frequency for the refresh rate if the access times of the memory section rise up. By this way, the error for memory section can be kept at a low level even if the access times of the memory section greatly increases.

An unified non-violate memory controlling method can be acquired in view of embodiments in FIG. 9-FIG. 11, which comprises the steps of acquiring a number of access times of the second memory section; and adjusting a refresh rate of the second memory section according to the number of access times.

The architectures in FIG. 2-FIG. 11 can be applied to any kind of electronic apparatus. In one embodiment, the architectures in FIG. 2-FIG. 11 are applied to an electronic apparatus that rarely accesses the second memory section M_2 of the non-volatile memory M. As above-mentioned, access speed of the non-volatile memory is lower than the volatile memory. Nevertheless, the access speed for the second memory section M_2 is sufficient for such electronic apparatus, since the second memory section M_2 is rarely accessed.

In one embodiment, the electronic apparatus architectures in FIG. 2-FIG. 11 are applied to an electronic apparatus applying Internet of Things (IOT). The IoT is the interconnection of uniquely identifiable embedded computing devices within the existing Internet infrastructure. Typically, IoT is expected to offer advanced connectivity of apparatuses, systems, and services that goes beyond machine-to-machine communications (M2M). Things, in the IoT, can refer to a wide variety of apparatuses such as heart monitoring implants, biochip transponders on farm animals, electric clams in coastal waters, automobiles with built-in sensors, or field operation devices that assist fire-fighters in search and rescue.

Figure 12:
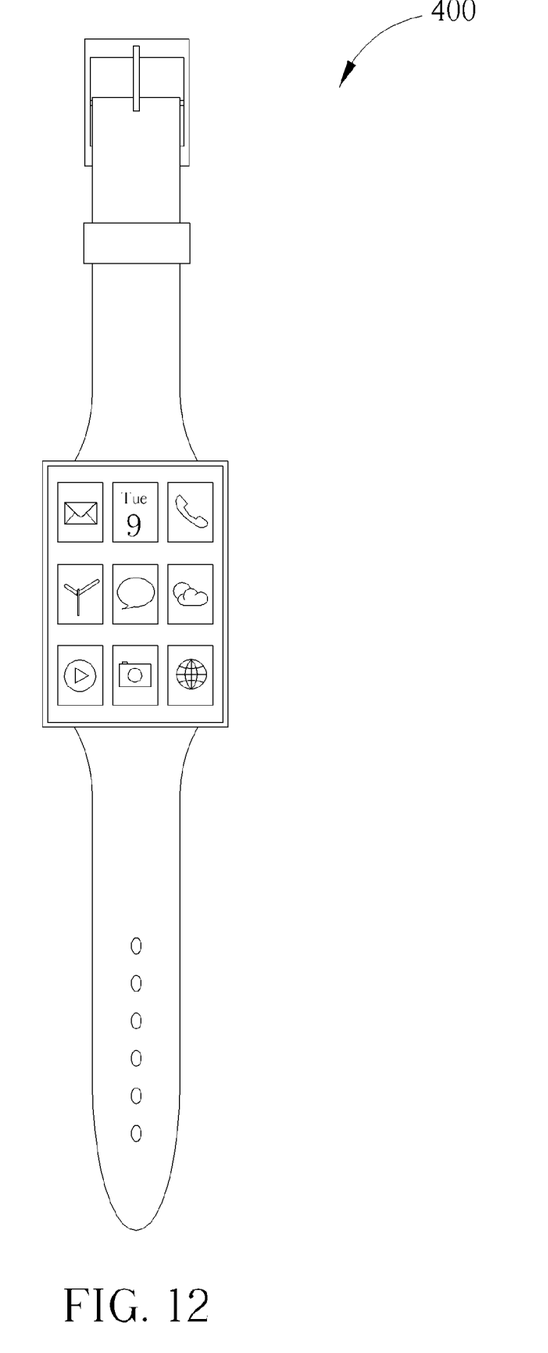
FIG. 12 is a schematic diagram illustrating an electronic apparatus applying IOT according to one embodiment of the present application.

FIG. 12 is a schematic diagram illustrating an electronic apparatus applying IOT according to one embodiment of the present application. As illustrated in FIG. 12, the electronic apparatus 400 is a smart watch, which can provide more functions besides function for a conventional watch. For example, the smart watch 400 can measure the blood pressure and the heart rate of the user and transmit to a server, such that a nursing assistant can remotely monitor health of the user. Alternatively, the user can control an air conditioner in his house via the smart watch, even he is not at home. The memory for such kind of electronic apparatus is accessed more rarely than other electronic devices, such as a smart phone, thus can apply the architecture depicted in FIG. 2-FIG. 11 of the present invention. However, FIG. 12 is only an example and does not mean the architectures depicted in FIG. 2-FIG. 11 can only be applied to such electronic apparatus. For example, the architectures depicted in FIG. 2-FIG. 11 can be applied to a TV applying IOT.

In view of above-mentioned embodiments, the refresh rate of the memory can be adjusted according to the number of access times. By this way, the endurance of the memory can be increased via simple steps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic apparatus, comprising:
   a unified non-volatile memory, comprising:
      a first memory section, served as a non-volatile memory; and
      a second memory section, served as a volatile memory; and
   a control unit, configured to control the unified non-volatile memory;
   wherein the first memory section further comprises:
      a first area for the first memory section; and
      a second area for the first memory section;
   wherein the control unit adjusts a refresh rate of the second memory section according to a number of access times of the second memory section;
   wherein the refresh rate is proportional to the number of access times.

2. The electronic apparatus of claim 1,
   wherein the second area for the first memory section stores a refresh times lookup table;
   wherein the control unit counts the number of the access times of the second memory section to generate access times information, and stores the access times information to the second area for the first memory section;
   wherein the control unit adjusts the refresh rate of the second memory section according to the access times information stored in the second area for the first memory section and the refresh times lookup table stored in the second area for the first memory section.

3. The electronic apparatus of claim 1, wherein the refresh rate of the second memory is proportional to the number of access times of the second memory section.

4. The electronic apparatus of claim 1,
   wherein the second area for the first memory section is configured to store code for the control unit;
   where the first area for the first memory section does not store code for the control unit and the control unit accesses the code from the second area for the first memory section, while the control unit is active;
   wherein data stored in the second memory section is backed up to the first area for the first memory section simultaneously, while the control unit is off.

5. The electronic apparatus of claim 1, wherein data retention of the second memory section is lower than data retention of the first memory section.

6. The electronic apparatus of claim 1, wherein the first memory section is served as a code memory for the control unit.

7. The electronic apparatus of claim 1, wherein the electronic apparatus is an electronic apparatus applying Internet of Things.

8. The electronic apparatus of claim 1, wherein the unified non-volatile memory is one of: a parameter random access memory, a phase change random access memory, a magnetoresistive random access memory, a ferroelectric random access memory, a conductive-bridging random access memory, and a resistive random access memory.

9. The electronic apparatus of claim 1, wherein a percentage of the unified non-volatile memory density for the first memory section, the second area for the first memory section, and the second memory section, are programmable.

10. An unified non-violate memory controlling method, applied to a unified non-volatile memory comprising a first memory section and a second memory section, wherein the first memory section is served as a non-volatile memory and the second memory section is served as a volatile memory, wherein the first memory section further comprises a first area for the first memory section; and a second area for the first memory section;
    wherein the unified non-violate memory controlling method comprises:
    acquiring a number of access times of the second memory section; and
    adjusting a refresh rate of the second memory section according to the number of access times;
    wherein the refresh rate is proportional to the number of access times.

11. The unified non-violate memory controlling method of claim 10,
    further comprising:
    storing a refresh times lookup table to the second area for the first memory section;
    counting the number of the access times of the second memory section to generate access times information, and storing the access times information to the second area for the first memory section; and
    adjusting the refresh rate of the second memory section according to the access times information stored in the second area for the first memory section and the refresh times lookup table stored in the second area for the first memory section.

12. The unified non-violate memory controlling method claim 10, wherein data retention of the second memory section is lower than data retention of the first memory section.

13. The unified non-violate memory controlling method of claim 10, wherein a percentage of the unified non-volatile memory density for the first memory section, the second area for the first memory section, and the second memory section, are programmable.

14. The unified non-violate memory controlling method of claim 10, wherein the unified non-volatile memory is one of: a parameter random access memory, a phase change random access memory, a magnetoresistive random access memory, a ferroelectric random access memory, a conductive-bridging random access memory, and a resistive random access memory.

15. The unified non-violate memory controlling method of claim 10, wherein the refresh rate of the second memory is proportional to the number of access times of the second memory section.

* * * * *